United States Patent
Hamdan et al.

(10) Patent No.: US 7,622,975 B2
(45) Date of Patent: Nov. 24, 2009

(54) CIRCUIT HAVING A LOCAL POWER BLOCK FOR LEAKAGE REDUCTION

(75) Inventors: Fad Ad Hamdan, Raleigh, NC (US);
Anthony D. Klein, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/775,376

(22) Filed: Jul. 10, 2007

(65) Prior Publication Data

US 2009/0015321 A1    Jan. 15, 2009

(51) Int. Cl.
*H03K 3/289*  (2006.01)
(52) U.S. Cl. .................. 327/202; 327/201; 327/203; 327/212; 327/218; 326/16; 326/38; 326/40; 326/46
(58) Field of Classification Search .................. 327/201, 327/202, 218
See application file for complete search history.

(56) References Cited

U.S. PATENT DOCUMENTS 6,078,194 A    6/2000  Lee
6,853,212 B2 *  2/2005  Chandar et al. ............... 326/16
7,323,909 B2    1/2008  Mamidipaka
2003/0188241 A1  10/2003  Zyuban et al.

FOREIGN PATENT DOCUMENTS

WO    03067759    8/2003

OTHER PUBLICATIONS

International Search Report, PCT/US2008/069708 - International Search Authority - European Patent Office, Sep. 25, 2008.

* cited by examiner

*Primary Examiner*—Lincoln Donovan
*Assistant Examiner*—John W Poos
(74) *Attorney, Agent, or Firm*—Nicholas J. Pauley; Peter Kamarchik; Sam Talpalatsky

(57) ABSTRACT

A circuit having a local power block for leakage reduction is disclosed. The circuit has a first portion and a second portion. The first portion is configured to operate at a substantially greater operating frequency than the operating frequency of the second portion. The second portion has a local power block configured to decouple the second portion if the second portion is inactive to reduce leakage current associated with the second portion without sacrificing performance of the first portion.

16 Claims, 6 Drawing Sheets

CIRCUIT HAVING A LOCAL POWER BLOCK FOR LEAKAGE REDUCTION

FIELD OF DISCLOSURE

The present disclosure relates generally to methods and systems for reducing leakage current in circuit design, and more specifically, to methods and systems for reducing leakage current in low activity circuitry while maintaining the performance of high activity circuitry.

BACKGROUND

With feature size becoming smaller in circuit design, power leakage is becoming a more significant portion of the overall power consumed by a circuit, such as a sequential circuit. Power leakage in circuit design is an important issue, particularly because power leakage can account for a significant proportion of the total power for an IC.

For example, FIG. 1 illustrates a conventional device (e.g., inverter) 100 having an input a, an output nz, a voltage source, and ground. A capacitor 102 is charged by the supply current Vdd. Theoretically, once the capacitor 102 is charged, there will be no current flowing through the circuit and there will be no power leakage through the circuit. However, this may not be true in practice, since devices may leak. Even though a device is supposed to be turned off or inactive there can still be some current flowing/leakage through the device. Hence, there will be power leakage through the device.

This problem becomes more prevalent as technology shrinks and becomes faster. The smaller and faster the circuits are designed to operate, the greater the leakage. Thus, as the circuit density increases the leakage due to the increased devices also increases. It is desirable to reduce such leakage because it is occurring all the time irrespective of whether the device is performing an activity, or whether the central processing unit (CPU) of the device is on or off. As long as there is a power supply connected to the circuit, leakage can be occurring. Thus, leakage can account for a significant portion of the overall power consumed by an integrated circuit (IC) in an inactive state or with a significant number of inactive circuits.

This is not as much of a problem during activity, when the dynamic power is greater. However, if no activity is being performed, then the dynamic power is less (e.g., it may be zero). Thus, in an inactive state, the leakage current will dominate the total power of the IC. This is particularly problematic with battery powered devices in which the power supply is limited.

In low power circuit designs, it is desired to minimize the leakage current without sacrificing performance. For example, conventionally, a device can be added to the overall circuit to block the path from the voltage source to the circuit, or the path from the circuit to the ground, in order to limit or reduce the leakage through the circuit. In one conventional system, a global header or global footer is added in the power supply path from the voltage source to the circuit to limit the leakage. In other words, the power source is decoupled from the circuit to reduce leakage during inactivity of the circuits. A global header is a decoupling device that is coupled between Vdd and the circuit, while a footer is a decoupling device that is coupled between the circuit and Vss.

However, conventional global headers/footers have to be scaled to pass and control large currents and use additional control signals that are connected to numerous locations in the circuit design. Such design requirements result in increased costs, for example, in terms of area occupied by the circuit on the IC and increased routing complexity. Such conventional designs also may reduce the performance of the IC, for example, by reducing the speed of the circuit and reducing performance, as described in more detail below.

A high threshold voltage (high $V_T$, or $HV_T$) device is used in the conventional global headers and global footers to limit the leakage. Such high $V_T$ devices may not cut the leakage to zero. However, high $V_T$ devices can at least significantly reduce the leakage. This reduction in leakage is particularly the case in comparison to low threshold voltage (low $V_T$, or $LV_T$) circuits which may be used in the operational circuits supplied by the header or footer. Conventionally, either a global header or a global footer is used, since a combination of global headers and global footers is redundant and provides no substantial benefit. Also, the additional headers/footers can further increase the area and cost of the circuit.

Additionally, conventional systems that use a global header or footer can be undesirable because the global header/footer acts like a resistance in series. Accordingly, each time the conventional circuit draws a current, the current passes through the header/footer, which is equivalent to being a resistor in series, thereby reducing efficiency and performance of the circuit. Thus, instead of having Vdd/Vss directly supplied to the circuit, the header circuit is turned on and charged, which can result in an increase in the overall power consumption during operation, as the global header/footer is scaled to supply large currents drawn by many circuit elements coupled to the global header/footer.

Additionally, a conventional system that uses a global header or footer may have substantial voltage/current spikes resulting from turning on the large global header/footer needed for the circuits to be coupled/decoupled to the power supply. Thus, some conventional systems use different ways to turn on the global header/footer to avoid spiking. For example, some conventional systems turn on the header/footer using an intermediary device to ramp up the voltage to avoid spikes and noise spikes at Vdd and VVdd. This can take a few cycles depending on the circuit configuration and further increases the overall system complexity. This conventional method is also undesirable because there is a wake-up time associated with this method.

For at least the foregoing reasons, the conventional global headers or footers can be expensive to implement, and can degrade performance significantly. Other conventional systems which use two power sources (i.e., one power source for high $V_T$ devices and another power source for low $V_T$ devices) are not practical or desirable because such configurations dramatically increase the cost of the circuit design, for example, in terms of area, complexity, having multiple power grids, etc.

Other conventional systems use high $V_T$ devices to try to limit or reduce leakage, since such devices require substantially greater voltage to turn on, and thus, may leak less than low $V_T$ or regular threshold voltage devices. However, the performance of high $V_T$ devices can be substantially lower than low $V_T$ or regular $V_T$ devices. Although, if performance is not an issue for a particular application, a high $V_T$ device may be suitable. Further, high $V_T$ devices do not work very well (i.e., satisfactorily) at low voltage because of the higher threshold voltage. Once the voltage is lowered, the devices do not work very well, if at all. Thus, high $V_T$ devices may not be a practical alternative for reducing or limiting leakage, in many (if not, most) applications.

For at least the reasons set forth above, conventional global headers and footers can be very expensive and require an additional (or dedicated) control signal to be connected to numerous locations in the circuit design, which increases the cost, for example, in terms of area occupied by the circuit on the IC. Such conventional designs also can increase the cost with respect to the performance of the IC, for example, by reducing the speed of the circuit and reducing performance.

Accordingly, there is a need for a method and system for reducing leakage while maintaining performance of a circuit.

SUMMARY

Exemplary embodiments of the invention are directed to systems and methods for reducing leakage current in circuit design, and more specifically, to methods and systems for reducing leakage current while maintaining the performance of the circuit.

In one embodiment, a circuit for reducing leakage is disclosed. The circuit can comprise a first portion and a second portion. The first portion can be configured to operate at a substantially greater operating frequency than an operating frequency of the second portion. The second portion can comprise a local power block configured to decouple the second portion if the second portion is inactive.

In another embodiment, a circuit can comprise a first portion and a second portion. The second portion can comprise a local power block configured to decouple the second portion in response to a control signal input to the second portion. The control signal can be a pre-existing signal configured to control the operation of the second portion.

In another embodiment, a method of reducing leakage in a circuit having, for example, a first portion and a second portion, is disclosed. The method can comprise providing a local power block configured to decouple the second portion if the second portion is inactive, and decoupling power to the second portion using the local power block in response to a control signal input to the second portion. The control signal can be a pre-existing signal configured to control the operation of the second portion.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to exemplary embodiments of the invention. Alternate embodiments may be devised without departing from the scope of the aspects of the invention. Additionally, well known elements of the embodiments of the invention will not be described in detail or will be omitted so as not to obscure the relevant details of the exemplary embodiments of the invention.

The word "exemplary" is used herein to mean "serving as an example, instance, or illustration." Any embodiment described herein as "exemplary" is not necessarily to be construed as preferred or advantageous over other embodiments. Likewise, the terms "embodiments" or "embodiments of the invention" does not require that all embodiments of the invention include the discussed feature, advantage or mode of operation.

The exemplary embodiments recognize and/or account for the distinctions between portions of a circuit operating at a low operating frequency and portions of the circuit operating at a high operating frequency. For example, one embodiment can include a circuit having a first and second portion. The embodiment can further include a local power block (e.g., a local header or local footer) configured to decouple only those portions of the circuit that are not high performance (i.e., portions of the circuit that are configured to operate at a low operating frequency or that are configured for lower activity), instead of having a global header or footer for all parts of the circuit.

The local power block can decouple the portion of the circuit configured to operate at a low operating frequency when it is inactive by, for example, interrupting the path from Vdd to the circuit, or from the circuit to ground. The local power block can be, for example, a local header or local footer, or other device for establishing a voltage block. For example, a local header circuit can block a voltage potential between Vdd and an artificial reference (e.g., VVdd), while a local footer circuit can block a voltage potential between Vss and an artificial reference (e.g., VVss).

Figure 1:
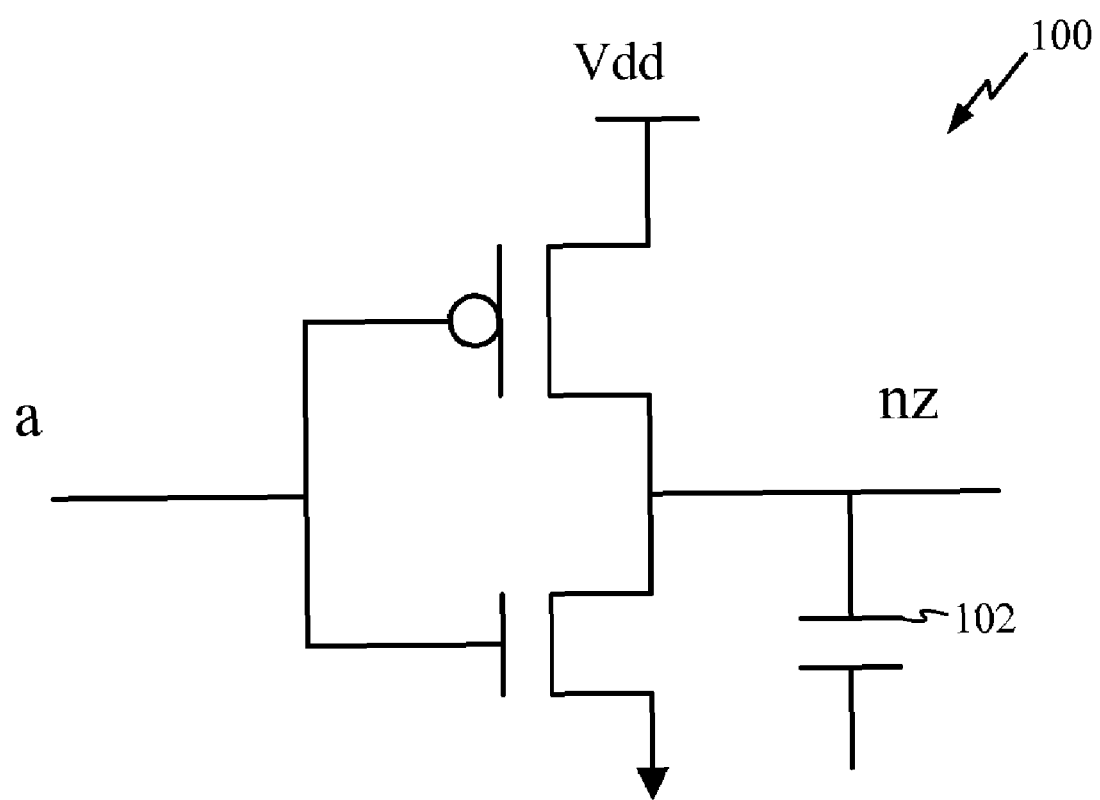
FIG. 1 is a schematic illustrating a conventional inverter circuit.
Figure 2:
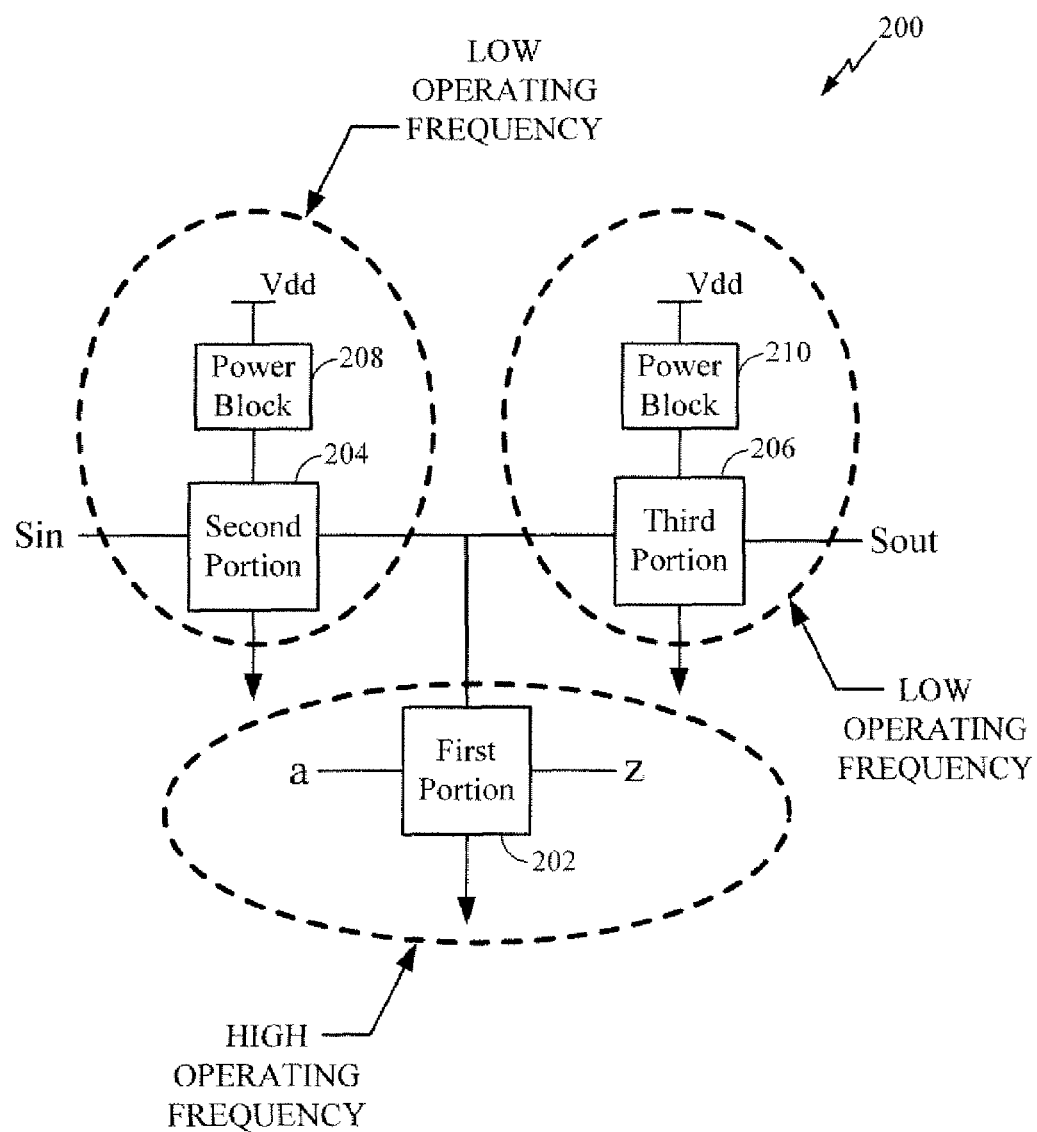
FIG. 2 is a schematic illustrating one embodiment of a circuit having a local power block configured to decouple a second portion operating at a low operating frequency.

FIG. 2 illustrates one embodiment of a circuit 200 having at least a first portion 202 and a second portion 204. The first portion 202 can be configured to operate at a substantially greater operating frequency (e.g., a higher performance portion) than the operating frequency of the second portion 204 (e.g., a lower performance portion). The second portion 204 can have a local power block 208 (e.g., a local header) configured to decouple the second portion 204 if the second portion 204 is inactive to reduce leakage current associated with the second portion 204 without sacrificing performance of the first portion 202, which is configured to operate at the substantially greater operating frequency than the second portion 204.

In another embodiment, the circuit 200 can have at least the first portion 202 and the second portion 204. In this embodiment, the second portion 204 can have a local power block 208 (e.g., a local header) configured to decouple the second portion 204 in response to a control signal (not shown) input to the second portion 204. In this embodiment, the control signal can be a pre-existing signal configured to control the operation of the second portion 204.

FIG. 2 also exemplarily illustrates a third portion of the circuit 206, which can be configured to operate at a low operating frequency. The third portion 206 can have another local power block 210 (e.g., a local header) configured to decouple the third portion 206 if the third portion 206 is inactive to reduce leakage current associated with the third portion 206 without sacrificing performance of the first portion 202, which can be configured to operate at the substantially greater operating frequency than the third portion 206. In another exemplary embodiment, the local power block (e.g., 208 or 210) can be shared among two or more portions (e.g., 204, 206) which are configured to operate at a low operating frequency.

Figure 3:
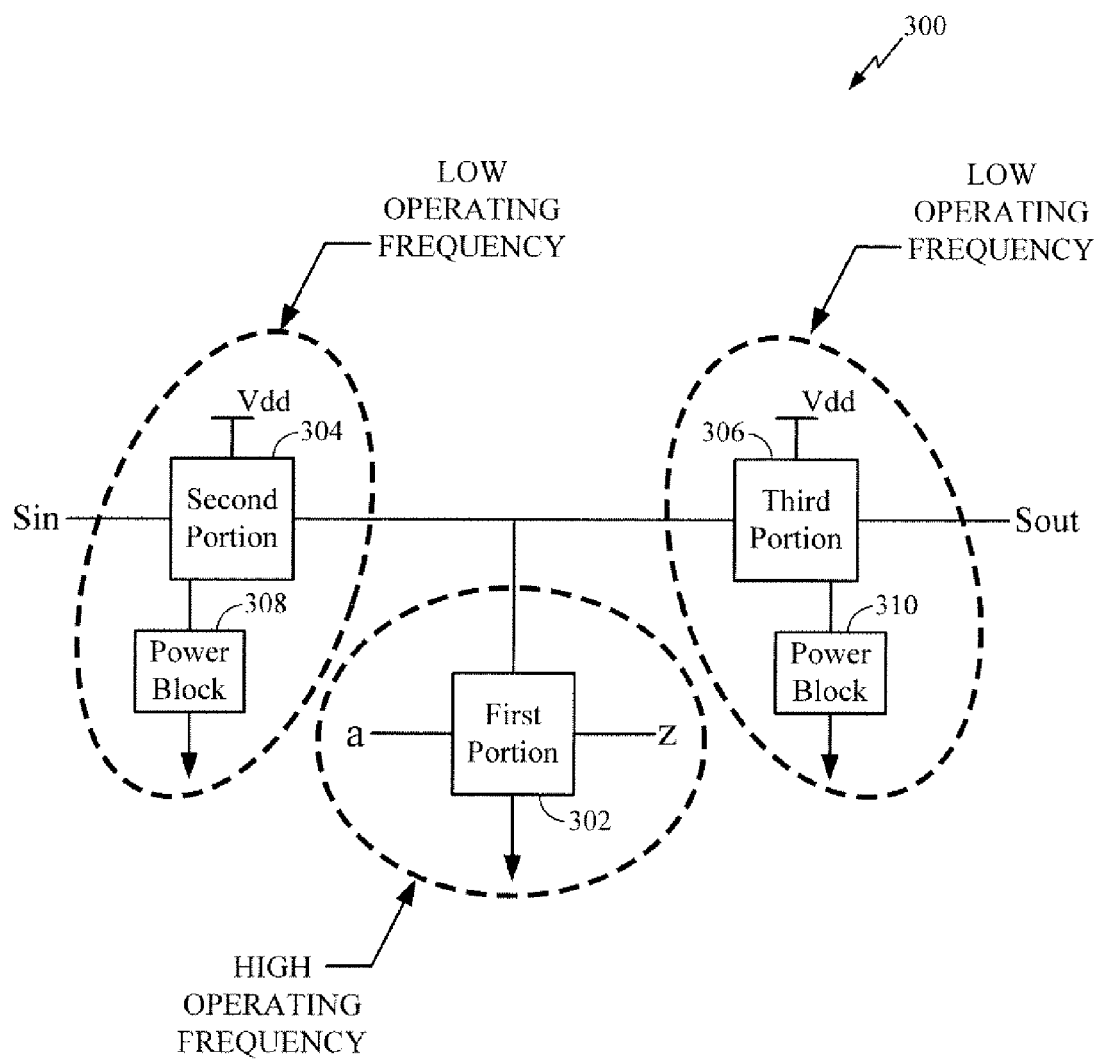
FIG. 3 is a schematic illustrating another embodiment of a circuit having a local power block configured to decouple a second portion operating at a low operating frequency.

As another example, FIG. 3 illustrates an embodiment of a circuit 300 having at least a first portion 302 and a second portion 304. The first portion 302 can be configured to operate at a substantially greater operating frequency than the operating frequency of the second portion 304. The second portion 304 can have a local power block 308 (e.g., a local footer) configured to decouple the second portion 304 if the second portion 304 is inactive to reduce leakage current associated with the second portion 304 without sacrificing performance of the first portion 302, which can be configured to operate at the substantially greater operating frequency than the second portion 304.

In another embodiment, the circuit 300 can have at least the first portion 302 and the second portion 304. In this embodiment, the second portion 304 can have a local power block 308 (e.g., a local footer) configured to decouple the second portion 304 in response to a control signal (not shown) input to the second portion. In this embodiment, the control signal can be a pre-existing signal configured to control the operation of the second portion 304. Examples of using a pre-existing signal to control the local power block will be provided in the following discussion of FIGS. 4 and 5.

FIG. 3 also illustrates a third portion of the circuit 306, which can be configured to operate at a low operating frequency. The third portion 306 can have another local power block 310 (e.g., a local footer) configured to decouple the third portion 306 if the third portion 306 is inactive to reduce leakage current associated with the third portion 306 without sacrificing performance of the first portion 302, which can be configured to operate at the substantially greater operating frequency than the third portion 306. In another exemplary embodiment, the local power block (e.g., 308 or 310) can be shared by two or more portions (e.g., 304, 306) which can be configured to operate at a low operating frequency.

In one aspect of the embodiments illustrated in FIGS. 2 and 3, the local power block (e.g., 208, 210, 308, 310) can receive a control signal (not shown) input for controlling operation of the second portion 204, 304. The local power block can be configured to decouple the second portion 204, 304 and the third portion 206, 306 in response to the control signal input to the second portion 204, 304.

In another embodiment, the local power block can be configured to decouple the second portion 204, 304 and/or the third portion 206, 306 in response to a pre-existing control signal (not shown) input to the second portion 204, 304 and/or the third portion 206, 306 for a designed operation of the second portion 204, 304 and/or the third portion 206, 306. This can include, for example, a signal that is already used to control the second portion 204, 304 and/or the third portion 206, 306 irrespective of whether the local power block is present in the circuit. Accordingly, no additional control signals will need to be generated or routed.

The embodiments are not limited to the arrangement illustrated in FIGS. 2 and 3. Other exemplary embodiments include local header/footers for sequential circuits, for example, a latch or a flip-flop, which have scan-based circuitry associated with them. Examples of these embodiments are illustrated in FIGS. 4 and 5 and will be described below.

Figure 4:
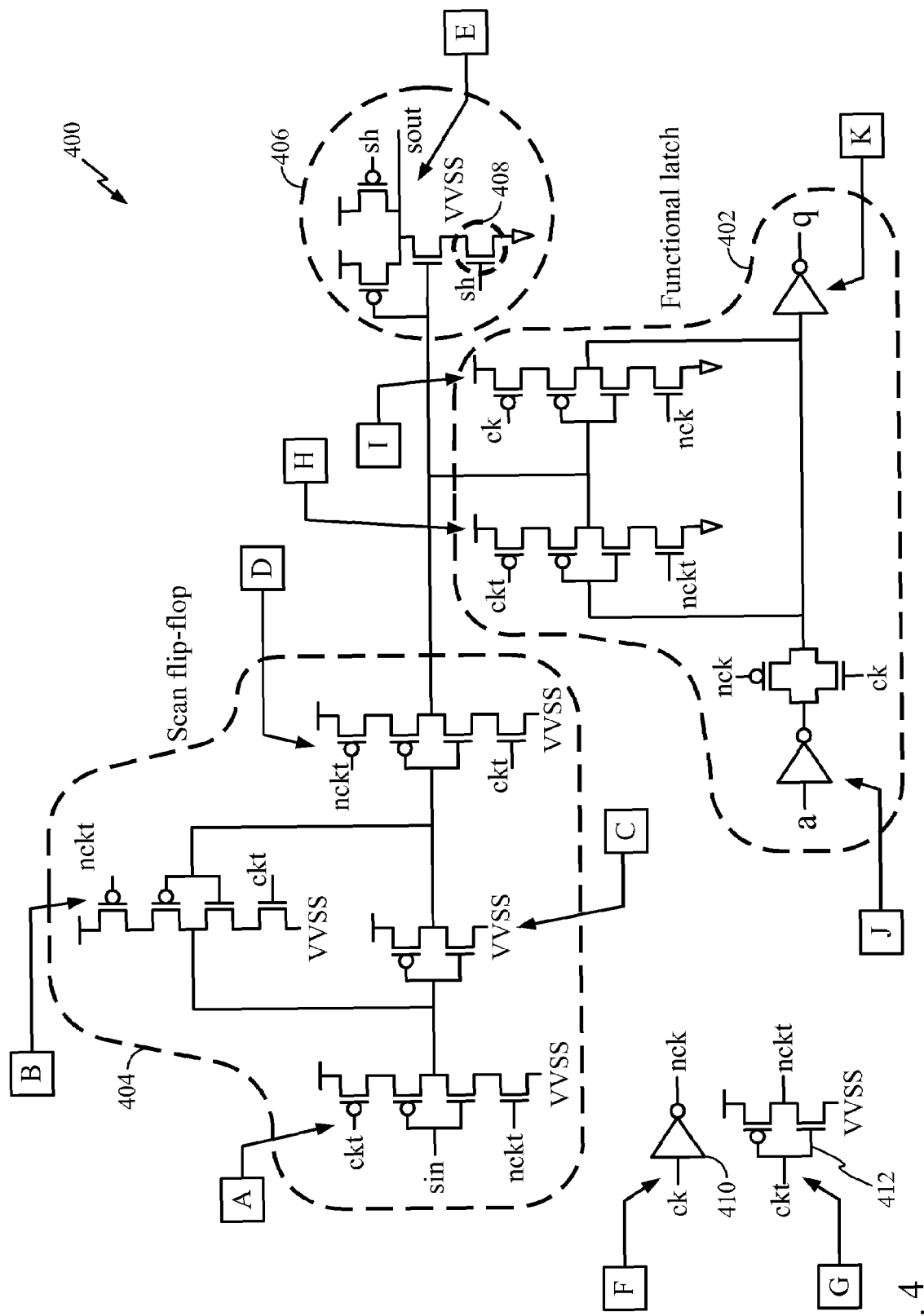
FIG. 4 is a schematic illustrating another embodiment of a circuit having a local power block configured to decouple a second portion operating at a low operating frequency.

FIG. 4 illustrates a latch circuit 400 (e.g., a latch) having a functional latch portion 402, a scan flip-flop portion 404, and a scan out portion 406. FIG. 5 illustrates a similar latch circuit 500 having a functional latch portion 502, a scan flip-flop portion 504, and a scan out portion 506. The scan flip-flop portion 404, 504 and the scan out portion 406, 506 may be used during testing of the device, or during a scan operation. For example, a scan or test operation is performed on the latch circuit 400, 500 at the foundry to determine if the latch circuit 400, 500 is operating properly prior to shipping from the foundry. After the latch circuit 400, 500 is shipped, the circuitry associated with the scan or test operation (e.g., the scan flip-flop portion 404, 504 and the scan out portion 406, 506) may no longer be used.

Figure 5:
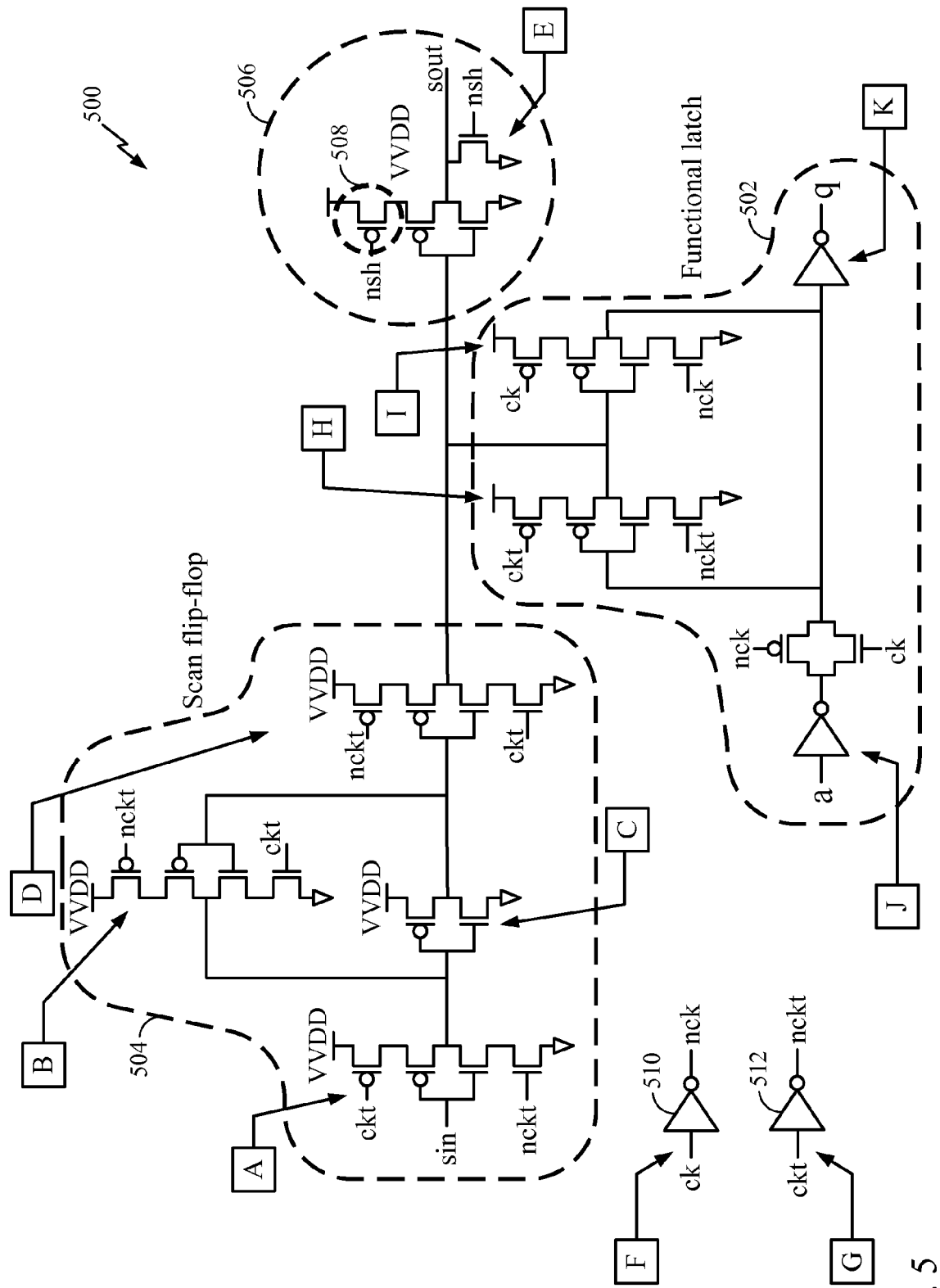
FIG. 5 is a schematic illustrating another embodiment of a circuit having a local power block configured to decouple a second portion operating at a low operating frequency.
Figure 6:
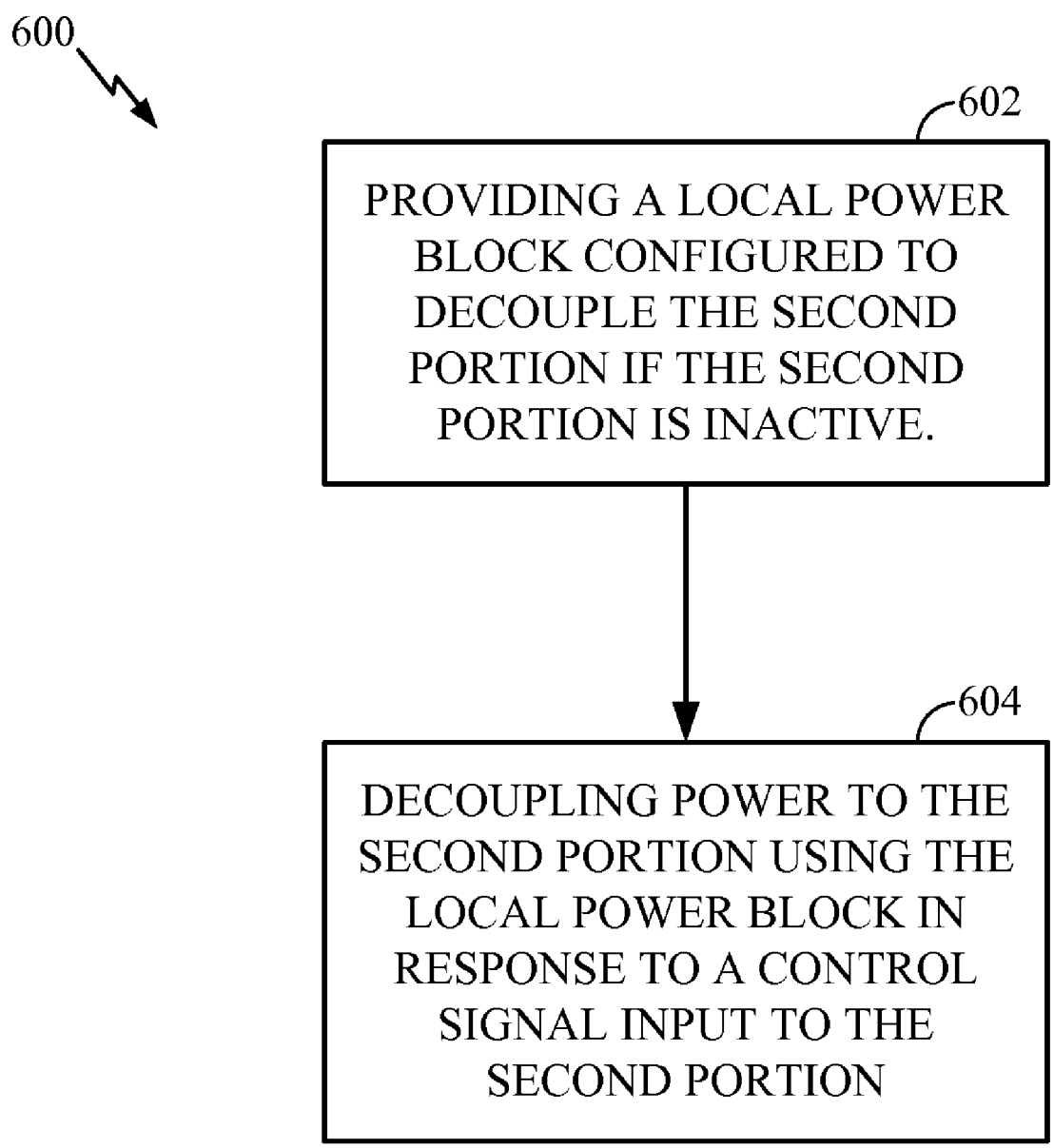
FIG. 6 is a flow diagram illustrating an embodiment of a method of reducing leakage in a circuit.

In the embodiments of FIGS. 4 and 5, the functional latch portion 402, 502 can serve a dual use or purpose in the latch circuit 400, 500 to conserve resources. The functional latch portion 402, 502 can have an input in port (a) and a data out port (q). For scanning operations, the scan flip-flop portion 404, 504 can be the master circuit, and the functional latch portion 402, 502 can be the slave circuit. During normal operation (e.g., not in a test/scan mode), the scan flip-flop portion 404, 504 and the scan out portion 406, 506 may not be used (i.e., configured to be inactive). Instead, only the functional latch portion 402, 502 may be configured to operate.

As a practical matter, the scan flip-flop portion 404, 504, the functional latch 402, 502, and the scan out portion 406, 506 may leak, even when these portions are not active (i.e., turned off). It is desirable to reduce such leakage in the example illustrated in FIGS. 4 and 5, in which the scan flip-flop portion 404, 504 and/or the scan out portion 406, 506 may not be used at all after the circuit is tested and the device has shipped from the foundry. That is, even though the scan flip-flop portion 404, 504 and the scan out portion 406, 506 may not be used after the device is shipped from the foundry, the scan flip-flop portion 404, 504 and the scan out portion 406, 506 of the circuit may leak, along with the functional latch 402, 502, whenever the circuit is supplied with power. Thus, leakage through the scan flip-flop 404, 504 and the scan out portion 406, 506 can result in a substantial amount of power leakage, and can account for a significant portion of the overall power consumed by the IC, even though these portions of the circuit may no longer be used.

When the device is not in the scan mode, the functional latch portion 402, 502 receives data from the data port a, and outputs data from the data port q. The functional latch portion 402, 502 can be optimized for performance because this portion can be used to carry out the function of the circuit. For example, one embodiment can use low $V_T$ devices in the functional latch portion 402, 502 to maximize performance. To reduce or minimize leakage in the scan flip-flop portions, an embodiment can use regular $V_T$ devices in the scan flip-flop portion 404, 504. It is noted that, while high $V_T$ devices can be used to minimize or reduce leakage even further, these high $V_T$ devices can compromise circuit operation at low voltages.

In the embodiment of FIG. 4, a local footer 408 (circled device) can be used as the local power block to reduce leakage. The local footer 408 can be configured to be coupled to the scan flip-flop portion 404 to switch off the Vss supply, thereby creating a virtual Vss (VVss) used for portions 404 and 406.

The embodiment illustrated in FIG. 4 can have a local and dedicated power block (e.g., local footer 408) to the scan flip-flop portion 404 and the scan out portion 406. Thus, by adding a single device 408 that is configured to decouple only the scan flip-flop portion 404 and/or the scan out portion 406, the size of the device 408 can be scaled so that the effect on the area of the circuit 400 is reduced. Moreover, the size of the local power block (e.g., local footer 408) can be minimized because it does not have to drive a large load. Instead, the local power block (e.g., local footer 408) can be dedicated only to the scan flip-flop portion 404 and/or the scan out portion 406.

The embodiment is not limited to a local power block (e.g., local footer 408) provided at the scan flip-flop portion 404 and the scan out portion 406. In another embodiment, first and second local power blocks (e.g., local footers—not shown) can be coupled to each of the scan flip-flop portion 404 and the scan out portion 406. In the embodiment illustrated in FIG. 4, a local footer 408, which is controlled by the shift signal (sh), can be used at the scan out portion 406 (e.g., $S_{out}$ NAND gate) to decouple the power from the scan flip-flop portion 404. However, embodiments of the invention are not limited to this aspect.

In the example illustrated in FIG. 4, a shift signal (sh) can be used to control the scanning operation. The shift signal (sh) is a known signal used for turning on scanning. The shift signal (sh) is an IC-wide signal available for various portions of the circuit. The shift signal (sh) gives the opportunity to store values in each sequential element for which a test is being performed for determining functionality of the circuit. The shift signal (sh) can enable the scan operation through the latch 402. The scan flip-flop portion 404 can be edge triggered to avoid racing through all of the latches.

The embodiment illustrated in FIG. 4 can take advantage of the shift signal (sh) already being an input to the latch circuit 400, as the control signal for controlling the scan operation. The embodiment can have a local power block (e.g., local footer 408) to decouple the scan flip-flop portion 404 and/or the scan out portion 406 of the circuit 400. Instead of tying a local footer 408 to a dedicated control signal, an embodiment can use the shift signal (sh), which is already used at the scan out portion 406 (e.g., $S_{out}$ NAND gate), to turn the local footer 408 on and off. That is, the local footer 408 can be controlled by the shift signal (sh), which is already configured to be supplied to the scan circuitry. Thus, this embodiment can significantly reduce the occupied area associated with decoupling the scan flip-flop portion 404 and the scan out portion 406 of the circuit 400, and hence, this embodiment can reduce the costs associated with this device.

Thus, the embodiment illustrated in FIG. 4 does not need other (e.g., special or dedicated) circuitry to control the local footer 408. Since the scan flip-flop portion 404 and scan out portion 406 may only be used during the scan or test operations, the shift signal (sh) can be used to power (e.g., couple and decouple) the scan flip-flop portion 404 and scan out portion 406. Conventionally, a footer may need a separate control signal to turn on and turn off. However, in this embodiment, the shift signal (sh) can be used to turn the local footer 408 on and off because, if the shift signal (sh) is on (i.e., supplied to the local footer 408), then the scanning procedure is being performed and the scan flip-flop portion 404 and the scan out portion 406 are coupled to the power source via the local footer 408. On the other hand, if the shift signal (sh) is off, then the scanning procedure is not being performed and the scan flip-flop portion 404 and the scan out portion 406 can be decoupled from the power source via the local footer 408. Thus, the local footer 408 can be powered up only during scanning and the embodiment illustrated in FIG. 4 does not need another signal to control it.

The shift signal (sh) is a static signal throughout the scan operation (i.e., it will not be turned on and off). Thus, the local footer 408 can be switched on to connect the scan flip-flop portion 404 and the scan out portion 406 to ground during the scan operation. When the scan operation is not being performed, the shift signal (sh) can be off, and thus, the local footer 408 can be switched off and the scan flip-flop portion 404 and scan out portion 406 can be decoupled from the ground, thereby reducing or limiting any leakage through the scan flip-flop portion 404 and scan out portion 406.

In addition, since the shift signal (sh) is a static signal (i.e., the shift signal (sh) does not toggle during the scan procedure), the local footer 408 can be a long channel device, a high $V_T$ device, etc., in order to further minimize leakage. Since the scan flip-flop portion 404 and scan out portion 406 may not be used after the scanning procedure is performed, the performance of the scan flip-flop portion 404 and scan out portion 406 will not impact operating performance.

The embodiment of FIG. 4 further can reduce leakage by coupling the test clock inverter 412 to the virtual supply node VVss. In this configuration, in the inactive state ckt is low and nckt will be high, rather than floating. Since the state of nckt will be stable, the circuit can be prevented from operating incorrectly, while still reducing leakage. Clock inverter 410 is not coupled to the virtual supply node, so there is no impact on clock inverter 410.

In the embodiment of FIG. 5, a local header 508 (circled device) can be used as the local power block to reduce leakage. The embodiment illustrated in FIG. 5 can add a local and dedicated power block (e.g., local header 508) to the scan flip-flop portion 504 and the scan out portion 506 to switch off the Vdd supply, thereby creating a virtual Vdd (VVdd) used for portions 504 and 506. Thus, by adding a single device 508 configured to decouple only the scan flip-flop portion 504 and/or the scan out portion 506, the size of the device 508 can be minimized so that the effect on the area of the circuit 500 can be reduced. Moreover, the size of the local power block (e.g., local header 508) can be minimized because it does not have to drive a large load. Instead, the local power block 508 can be dedicated only to the scan flip-flop portion 504 and/or the scan out portion 506.

Embodiments of the invention are not limited to a local power block (e.g., local header 508) provided at the scan flip-flop portion 504 and scan out portion 506. In another embodiment, a second local power block (e.g., a local header or footer—not shown) can be coupled to the scan flip-flop portion 504. In the embodiment illustrated in FIG. 5, a local header 508, which is controlled by a not-shift (nsh) signal, can be used at the Sout NOR gate to establish a local virtual supply node (e.g., VVdd) and decouple the power from the scan flip-flop portion 504 and the scan out portion 506. However, the embodiment is not limited to this aspect.

The embodiment illustrated in FIG. 5 can take advantage of the not-shift (nsh) signal already being an input to the latch circuit 500, as the control signal for controlling the scan operation. Instead of tying a local header 508 to a dedicated control signal, an embodiment can use the not-shift signal (nsh), which is already used at the Sout NOR gate, to turn the local header 508 on and off. That is, the local header 508 can be controlled by a signal which is already being supplied to the scan circuitry. Thus, this embodiment can reduce the occupied area associated with decoupling the scan flip-flop portion 504 and the scan out portion 506 of the circuit 500, and hence, the costs associated with this device.

The embodiment illustrated in FIG. 5 may not need other (e.g., special or dedicated) circuitry to control the local header 508. Since the scan flip-flop portion 504 and scan out portion 506 may only be used during the scan or test operations, the not-shift signal (nsh) can be used to power (e.g., couple and decouple) the scan flip-flop portion 504 and/or scan out portion 506. If the not-shift signal (nsh) is off, then the scanning procedure is not being performed and the scan flip-flop portion 504 and the scan out portion 506 can be decoupled from the power source via the local header 508, thereby reducing or limiting any leakage through the scan flip-flop portion 504 and/or scan out portion 506.

In contrast to the embodiment of FIG. 4, the embodiment illustrated in FIG. 5 does not couple the test clock inverter 512 to the virtual power supply node. The inverter 512 is not coupled to the virtual power supply node because with the input (ckt) to inverter 512 low in the inactive state, the output of the inverter 512 would be floating, which could negatively impact the operation of the functional latch 502. Further, as in FIG. 4, clock inverter 510 is not coupled to a virtual power supply.

As mentioned above, scan circuits may only be used to test or scan an IC, or portions thereof, before the IC leaves the foundry to determine if the IC is operating properly. The scan circuits may not be for design operations. These scan circuits may not be used again after the IC is shipped from the foundry, and therefore, the performance of the scan or test circuits is not a priority in the circuit design. Accordingly, the scan circuits can be configured to operate at a lower operating frequency than the functional latch portions of the circuit.

In some applications, each sequential element of a circuit can have a scan portion. The scan circuits can be half the size of each latch, which accounts for a large portion of the IC area. For example, an IC can include thousands of latches, which can account for 25% of the IC area. Thus, half of this area can be the scan circuits of the latches, which can account for a significant area of the circuit and a significant source of leakage. Even though the scan portions of each latch may not be used for field operation, the scan portions can leak because they are coupled to VDD. That is, even though invertors, cascades, gated inverters, etc. can be turned off, they can still leak. Thus, if the leakage from the scan portions of the latches can be prevented or limited, the overall leakage of the IC can be significantly reduced.

In other words, the functional latch 402, 502, the scan flip-flop portion 404, 504, and the scan out portion 406, 506 may leak even when these portions are not active (i.e., turned off). It is desirable to reduce such leakage in the example illustrated in FIGS. 4 and 5, in which the scan flip-flop portion 404, 504 and the scan out portion 406, 506 may not be used at all after the circuit is tested and the device has shipped from the foundry. That is, even though the scan flip-flop portion 404, 504 and the scan out portion 406, 506 may not be used (i.e., may not be configured to operate) after the device is shipped from the foundry, the scan flip-flop portion 404, 504 and the scan out portion 406, 506 of the circuit can leak whenever the circuit is supplied with power. Thus, leakage through the scan flip-flop 404, 504 and the scan out portion 406, 506 can result in a substantial amount of power leakage, and can account for a significant portion of the overall power consumed by the IC, even though these portions of the circuit may no longer be used.

In the embodiments illustrated in FIGS. 2-5, the local power block can be configured to reduce or avoid the impact on the functional portion of the circuit (e.g., the first portion 202, 302 illustrated in FIGS. 2 and 3, and the latch 402, 502 illustrated in FIGS. 4 and 5). Thus, the embodiments can reduce or limit any degradation in the performance of the first portion (i.e., functional portion). On the other hand, the scan portion of the circuit can be designed for lower performance (e.g., operating frequency). Thus, one embodiment can have a small, long channel, local power block (e.g., local footer) for significantly reducing leakage in the scan portion of the circuit. The local power block can be reduced in size as compared to a global header or footer and may even be formed from a minimum sized device (e.g., transistor) based on the configuration of the second portion which is being decoupled.

Another embodiment can include a method 600, as exemplarily illustrated in FIG. 8, of reducing leakage in a circuit having a first portion (e.g., 202, 302, 402, 502) and a second portion (e.g., 204, 304, 404, 504). The method 600 can include, in block 602, providing a local power block (e.g., 208, 308, 408, 508), configured to decouple the second portion, if the second portion is inactive. The method 600 can further include, in block 604, decoupling power to the second portion using the local power block in response to a control signal (e.g., shift (sh), not-shift (nsh)) input to the second portion. In one embodiment, the control signal can be a pre-existing signal configured to control the operation of the second portion. In a further embodiment, the local power block can be a device that both decouples the power to the second portion and functionally operates in the second portion. For example, transistor 408 in the NAND gate of 406 and transistor 508 in the NOR gate of 506 both function as local power blocks and as part of the respective gates. Accordingly, no additional devices are needed in the respective circuits.

Further aspects of the embodiments disclosed above will now be described with reference to the exemplary embodiments illustrated in FIGS. 4 and 5. It can be seen that each of the illustrated latch circuits (e.g., 400, 500) has eleven portions A, B, C, D, E, F, G, H, I, J, and K forming the circuit. In the embodiments of FIGS. 4 and 5, portions A, B, C, D, E, and G of each circuit can be associated only with performing the scan operation (e.g., 404, 406 and 504, 506), while four portions H, I, J, and K of each circuit can be associated with the latch portion (e.g., 402, 502).

As can be seen in the examples illustrated in FIGS. 4 and 5, if a conventional global footer or a global header is configured to couple or uncouple the voltage supply to all of the eleven portions A, B, C, D, E, F, G, H, I, J, and K of the circuit, a global header/footer of a substantial size and a substantial capacity will be needed for all eleven portions. Also, such global headers and footers can affect or degrade the performance of the circuit. Alternatively, if the effect on performance is to be reduced, then a global header or footer is not used and all eleven portions of the circuit may leak, including the scan portions, which may not be configured to be used after the scan operations are performed (i.e., after the IC is tested and shipped from the foundry).

In comparison, the exemplary embodiments of the latch circuit 400, 500 illustrated in FIGS. 4 and 5 can reduce or eliminate the effect of leakage on the overall performance of the circuit 400, 500. In the latch circuit 400, 500 illustrated in FIGS. 4 and 5, the leakage through the seven portions A, B, C, D, E, and G (in 400) of the circuit 400, 500, which can be used for scanning (e.g., the portions of the scan flip-flop 404, 504 and the scan output 406, 506), can be substantially reduced or eliminated by the local power block (e.g., local footer 408, local header 508). This can result in a substantial reduction in current leakage, while minimizing or avoiding any reduction in the performance of the functional part of the circuit 400, 500. Only, the portions G (in 500), H, I, J, and K of the circuits 400, 500 associated with the functional latches 402, 502 will have their leakage unaffected. Thus, the leakage through the latch circuit 400, 500 illustrated in FIGS. 4 and 5 is substantially reduced compared to the leakage in conventional latch circuits.

The embodiments are not limited to latch or scan mode circuitry. Other embodiments can be applied to any circuit that has one or more high performance portions and one or more low performance portions for a low activity mode, which may be mutually exclusive from the functional mode of the high performance portions.

The difference between high performance and low performance portions of the circuit may depend on several factors, for example, the technology involved, the configuration of the circuits, whether a circuit is in a critical processing path, etc. In some embodiments, high performance portions may be determined based on the circuits that dictate the overall performance of the IC; for example, critical path/pass circuits that limit the speed of the overall IC. On the other hand, the low performance portions of the circuit can be defined as those portions of the circuit, such a scan circuitry, which have little or no impact on the performance of the overall IC or are inactive during normal operation (e.g., test circuits), but still can impact the overall power consumption of the IC. For example, in the circuits illustrated in FIGS. 4 and 5, the operation of the functional latch 402, 502 can impact the frequency response/performance during normal operation, while the scan portion (e.g., scan flip-flop portion 404, 504 and scan out portion 406, 506) is only used for testing purposes, but still can impact the power consumption of the IC.

The embodiments are not limited to the arrangements illustrated in FIGS. 2-6. Other embodiments can have one or more portions of the circuit that are configured to operate at a higher operating frequency than one or more portions of the circuit that are configured to operate at a lower operating frequency. In other embodiments, the local power block can be one or more local headers/footers for one or more lower performance portions. The selection of the local header or local footer can be based on the configuration of the circuit and/or portions of the circuit to which the local power block is being used to decouple the power source.

In a circuit configured to have a higher performance path (e.g., configured to operate at a higher operating frequency), it is desirable to avoid or reduce the reduction in performance, for example, associated with using a global header or a global footer to minimize leaking. However, reducing leakage for lower performance portions of the circuit is desirable. Thus, the embodiments can configure the circuit such that a higher performance portion (or portions) of the circuit can be connected directly to the voltage supply, in order to minimize or limit a reduction in performance of the higher performance portion (or portions) of the circuit. The lower performance portion (or portions) of the circuit can have a local power block (e.g., a local header or local footer) to minimize leaking from the lower performance portion (or portions) of the circuit. Thus, the embodiments can selectively have a localized power block (e.g., a local header or a local footer) configured to be coupled only to a lower performance portion of the circuit, instead of a global header coupled to all portions (e.g., higher performance portions and lower performance portions) of the circuit.

In embodiments having more than one lower performance portion, each lower performance portion can have a localized power block or multiple portions can share a common local power block. Design considerations for selecting a common local power block for multiple low performance portions can include the availability of an existing control signal to activate/deactivate the common local power block, an existing device to serve as the local power block (e.g., a NAND gate transistor in FIG. 4), the total current switched and the proximity of the portions the lower performance portions. Thus, the physical size and configuration of each localized power block can be designed to reduce the area used, costs and power consumed because each localized power block can serve only the lower performance portion (or portions) of the circuit for which it is configured to decouple from the power source.

Embodiments of the invention reduce performance variations, for example, resulting from using a global header or footer that decouples power to the higher performance portion (or portions) of the circuit, while still reducing leakage in the lower performance portions of the circuit. The higher performance portion (or portions) of the circuit may leak, since the higher performance portion (or portions) does not have a local header or local footer. However, the leakage of the lower performance portions of the circuit can account for a significant portion of the overall leakage, and thus, can be a considerable portion of the power loss by the circuit.

It should be appreciated that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit comprising:
a first portion comprising a functional latch circuit; and
a second portion comprising a scan flip-flop portion adapted to store a scan input,
wherein the first portion is configured to operate at a substantially greater operating frequency than an operating frequency of the second portion, and
wherein the second portion further comprises a local power block configured to decouple the second portion if the second portion is inactive.

2. The circuit according to claim 1, wherein the local power block is configured to decouple the second portion in response to a control signal input to the second portion.

3. The circuit according to claim 2, wherein the control signal is a pre-existing signal configured to control the operation of the second portion.

4. The circuit according to claim 1, wherein the local power block comprises a local footer circuit.

5. The circuit according to claim 4, wherein the local footer circuit is configured to decouple the scan flip-flop circuit in response to a shift signal supplied to the scan flip-flop circuit for performing a scanning procedure for testing operation of the circuit.

6. The circuit according to claim 1, wherein the local power block is an element in the circuit that is configured to both function as the local power block and to perform an operational function in the second portion.

7. The processor according to claim 1, wherein the local power block is an element in the sequential circuit that is configured to both function as the local power block and to perform an operational function in the second portion.

8. The circuit according to claim 1, wherein the local power block comprises a local header circuit.

9. The circuit according to claim 8, wherein the local header circuit is configured to decouple the scan flip-flop circuit in response to a not-shift signal supplied to the scan flip-flop circuit for performing a scanning procedure for testing operation of the circuit.

10. A processor including a sequential circuit, the sequential circuit comprising:
a first portion comprising a functional latch circuit; and
a second portion comprising a scan flip-flop portion adapted to store a scan input, wherein the second portion comprises a local power block configured to decouple the second portion in response to a control signal input to the second portion, and wherein the control signal is a pre-existing signal configured to control the operation of the second portion.

11. The processor according to claim 10, wherein the first portion is configured to operate at a substantially greater duty cycle than a duty cycle of the second portion.

12. The processor according to claim 10, wherein the first portion is configured to operate at a substantially greater operating frequency than an operating frequency of the second portion.

13. The processor according to claim 10, wherein the local power block comprises a local footer circuit.

14. The processor according to claim 13, wherein the pre-existing signal comprises a shift signal.

15. The processor according to claim 10, wherein the local power block comprises a local header circuit.

16. The processor according to claim 15, wherein the pre-existing signal comprises a not-shift signal.

* * * * *

UNITED STATES PATENT AND TRADEMARK OFFICE
CERTIFICATE OF CORRECTION

| | | |
|---|---|---|
| PATENT NO. | : 7,622,975 B2 | Page 1 of 1 |
| APPLICATION NO. | : 11/775376 | |
| DATED | : November 24, 2009 | |
| INVENTOR(S) | : Fadi Adel Hamdan | |

It is certified that error appears in the above-identified patent and that said Letters Patent is hereby corrected as shown below:

On the Title page
Item (75) Inventors: change inventor's name from "Fad Ad Hamdan" to "Fadi Adel Hamdan".

Signed and Sealed this
Twenty-first Day of June, 2011

David J. Kappos
*Director of the United States Patent and Trademark Office*